Figure 1:
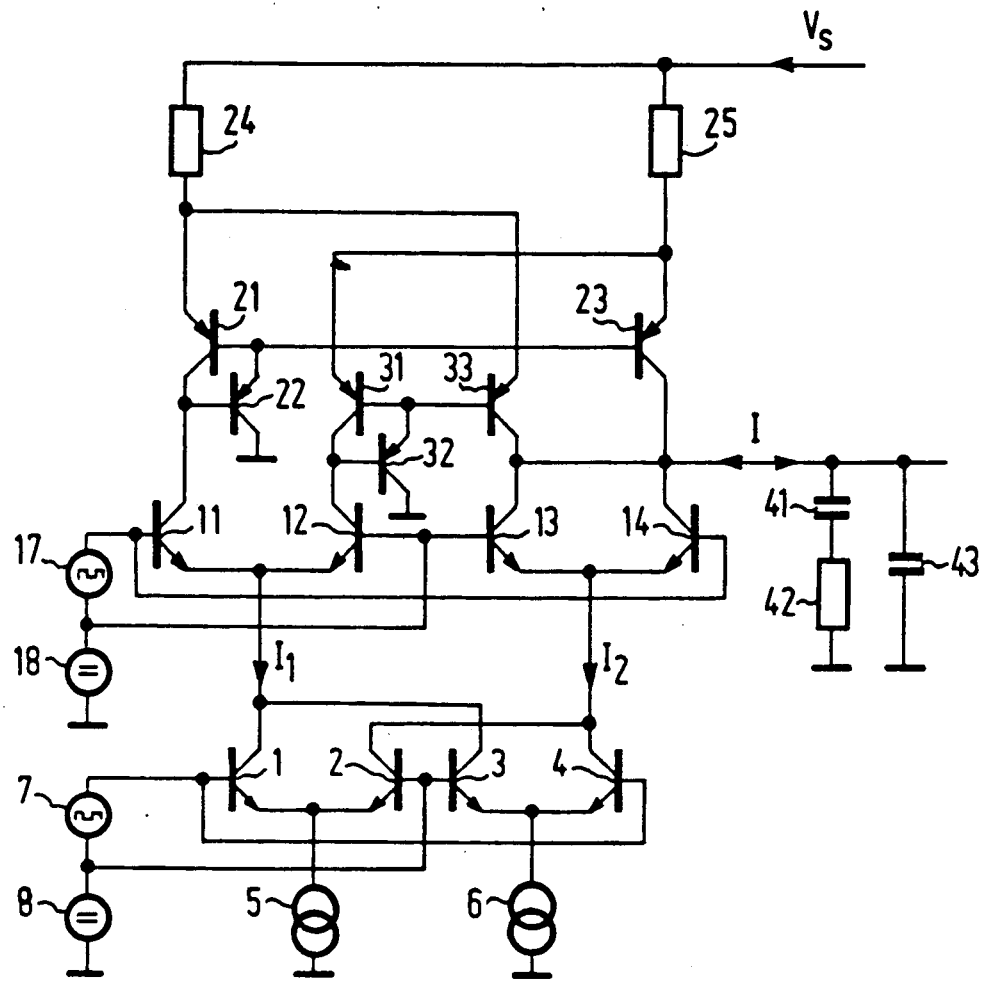

United States Patent [19]

Janta et al.

[11] Patent Number: 5,039,889

[45] Date of Patent: Aug. 13, 1991

[54] PHASE COMPARISON CIRCUIT

[75] Inventors: Dieter Janta, Hamburg; Winfried Jansen, Ellerbek, both of Fed. Rep. of Germany

[73] Assignee: U.S. Philips Corp., New York, N.Y.

[21] Appl. No.: 565,823

[22] Filed: Aug. 10, 1990

[30] Foreign Application Priority Data

Aug. 19, 1989 [DE] Fed. Rep. of Germany ....... 3927381

[51] Int. Cl.$^5$ .......................... H03K 5/26; H03L 7/00
[52] U.S. Cl. .................................. 307/514; 307/516; 307/529; 328/133
[58] Field of Search ............... 307/511, 514, 516, 529, 307/498, 262, 254; 328/133, 134, 155; 323/315; 330/288, 254; 331/27

[56] References Cited

U.S. PATENT DOCUMENTS

| | | | |
|---|---|---|---|
| 3,875,522 | 4/1975 | Hoeji ...................... | 330/254 |
| 3,946,330 | 3/1976 | Takahashi ............... | 331/27 |
| 3,970,868 | 7/1976 | Clements et al. ........ | 307/516 |
| 4,256,980 | 3/1981 | Asada et al. ............. | 307/254 |
| 4,614,911 | 9/1986 | Kawano ................... | 307/516 |
| 4,629,914 | 12/1986 | Okanobu .................. | 307/511 |
| 4,801,827 | 1/1989 | Metz ........................ | 307/529 |
| 4,808,856 | 2/1989 | Tanigawa ................. | 307/511 |
| 4,870,303 | 9/1989 | McGinn ................... | 307/511 |

*Primary Examiner*—Stanley D. Miller
*Assistant Examiner*—Toan Tran
*Attorney, Agent, or Firm*—Steven R. Biren

[57] ABSTRACT

A phase comparison circuit includes a double balanced mixer stage which receives a sine signal as well as this sine signal in anti-phase and a square-wave switching signal of the same nominal frequency, two active current mirror circuits are used which incorporate at least two common negative feedback circuit elements, the first of which is operative in the input-sided negative feedback of the first current mirror circuit and in the output-sided negative feedback of the second current mirror circuit and the second of which is operative in the reverse way. The two current mirror circuits are alternately connected to the two balanced mixer stages by means of a switching stage during the half cycle clock of the switching signal.

6 Claims, 2 Drawing Sheets

PHASE COMPARISON CIRCUIT

The invention relates to a phase comparison circuit, particularly for a phase-locked loop (PLL) in a decoder for multiplex signals, comprising a double balanced mixer stage which receives a sine signal, particularly the pilot of a multiplex signal, as well as said sine signal in anti-phase and a square-wave switching signal of the same switching frequency, which switching signal is derived particularly from the frequency of a phase-locked loop.

Such phase comparison circuits are particularly used in stereo decoders in which stereo multiplex signals, for example, for FM stereo radio are decoded in which the signals for the left and right channels are gained. These decoders generally comprise double balanced mixer stages one of which receives the pilot signal (19 kHz) while the other balanced mixer stage receives the same signal in anti-phase. The phase comparison circuit, which forms part of a phase-locked loop (PLL) in such decoders, receives a square-wave switching voltage which is derived from the frequency of a voltage-controlled oscillator of the phase-locked loop and which has the same frequency as the pilot signal when the phase-locked loop is locked.

The phase comparison circuit is used to control the phase-locked loop provided with a voltage-controlled oscillator in such a way that the pilot signal and the square-wave switching signal of the phase-locked loop are in a nominal phase position relative to each other. This is effected in such a way that an output signal which is proportional to the sine signal is constantly supplied during time intervals which are synchronous with the half cycles of the switching signal. This signal is integrated in a subsequent low-pass filter circuit. When the square-wave switching signal and the sine signal are in a nominal phase position with respect to each other, the output signal of the low-pass filter is zero because the portions of the signal before and after the zero-crossing are integrated during the time intervals and cancel each other out.

Such phase comparison circuits present the problem that the signals supplied during the two half cycles of the switching signal may have an offset. This offset is caused by the fact that the sine signal is not evaluated in the same manner during the two half cycles of the switching signal. This is generally caused by the fact that a current mirror circuit which is alternately connected to the two balanced mixer stages during the half cycle clock of the switching signal does not operate exactly, i.e. its output current is not equal to its input current. As a result, a DC component occurs in the low-pass filter succeeding the phase comparison circuit so that a phase error between the sine signal and the square-wave switching signal occurs, which error is often unacceptable.

It is true that this offset current can be compensated for by using a potentiometer, however this requires an extensive adjustment process.

It is an object of the invention to provide a phase comparison circuit of the type described in the opening paragraph which operates without any adjustment and any phase error between the sine signal and the square-wave switching signal.

According to the invention this object is achieved in that two active current mirror circuits are provided whose outputs supply the phase comparison signal and in which at least two common negative feedback circuit elements are arranged, the first element being operative in the input-sided negative feedback of the first current mirror circuit and in the output-sided negative feedback of the second current mirror circuit, and the second element being operative in the output-sided negative feedback of the first current mirror circuit and in the input-sided negative feedback of the second current mirror circuit, and in that the two current mirror circuits are alternately connected to the two balanced mixer stages by means of a switching stage during the half cycle clock of the switching signal.

In active current mirror circuits, which generally comprise three transistors, the degree of accuracy is particularly determined by the negative feedback circuit elements which must be extremely accurate. Generally, resistors are provided as negative feedback circuit elements. If these resistors deviate from each other, even if it is to a small extent, the above-mentioned problem of the offset current arises. In the phase comparison circuit according to the invention two current mirror circuits are provided which are alternately operative and are connected to the two balanced mixer stages by means of a switching stage during the half cycle clock of the switching signal. This means, for examPle, that the first current mirror circuit is operative during the first half cycle of the square-wave switching signal and has, for example, its input connected to the first balanced mixer and its output connected to the second balanced mixer. In this example the second current mirror circuit would then be active during the second half cycle and have its input connected to the second balanced mixer and its output connected to the first balanced mixer.

Two common negative feedback circuit elements, for example, resistors are provided for the two current mirror circuits. Such a negative feedback circuit element is operative for the input-sided negative feedback of the one current mirror circuit as well as for the output-sided negative feedback of the other current mirror circuit. The reverse also applies to the other negative feedback circuit element.

Because of this "cross-wise" operation of the two negative feedback circuit elements it is achieved that in the case of a difference between the resistances of the two negative feedback circuit elements, thus in the case of an offset current occurring during one half cycle of the square-wave switching signal, this offset current occurs with a reverse sign during the other half cycle of the square-wave switching signal. These offset currents, which have the same value but a different sign, are averaged in an integrator succeeding the phase comparison circuit. In this way resistance fluctuations of the two negative feedback circuit elements no longer have any effect, which may lead to a much higher accuracy of a phase-locked loop in which the phase comparison circuit according to the invention can be used.

In accordance with a further embodiment of the invention the switching stage has two transistors which in the half cycle clock of the switching signal alternately connect the output of one of the two balanced mixer stages to the input of the first current mirror circuit during one half cycle and which connect the output of the second balanced mixer stage to the input of the second current mirror circuit during the other half cycle, and in that two further transistors connect the outputs of the current mirror circuits to the respective other mixer. In spite of its simple structure, such a switching stage, which may be advantageously controlled by means of the square-wave switching signal, provides the possibility of connecting the two current mirror circuits to the double balanced mixer in the manner described above. Since the outputs of the two current mirror circuits are interconnected, the two last-mentioned transistors of the switching stage are adapted to ensure that the same switching processes take place for reasons of symmetry at the current mirror inputs and outputs.

In accordance with a further embodiment of the invention two transistors are provided as negative feedback circuit elements whose differential output resistances of the collector-emitter paths determine the input-sided and output-sided negative feedback of the current mirror circuits and whose base bias is processed in dependence upon the square-wave switching signal by means of two further transistors which alternately supply the base bias during a respective half cycle of the switching signal.

This modified current mirror circuit in the phase comparison circuit is particularly advantageous in that its output resistance is considerably higher than in current mirror circuits in which resistors are arranged as negative feedback circuit elements. Moreover, such a circuit can be integrated more easily.

Figure 2:
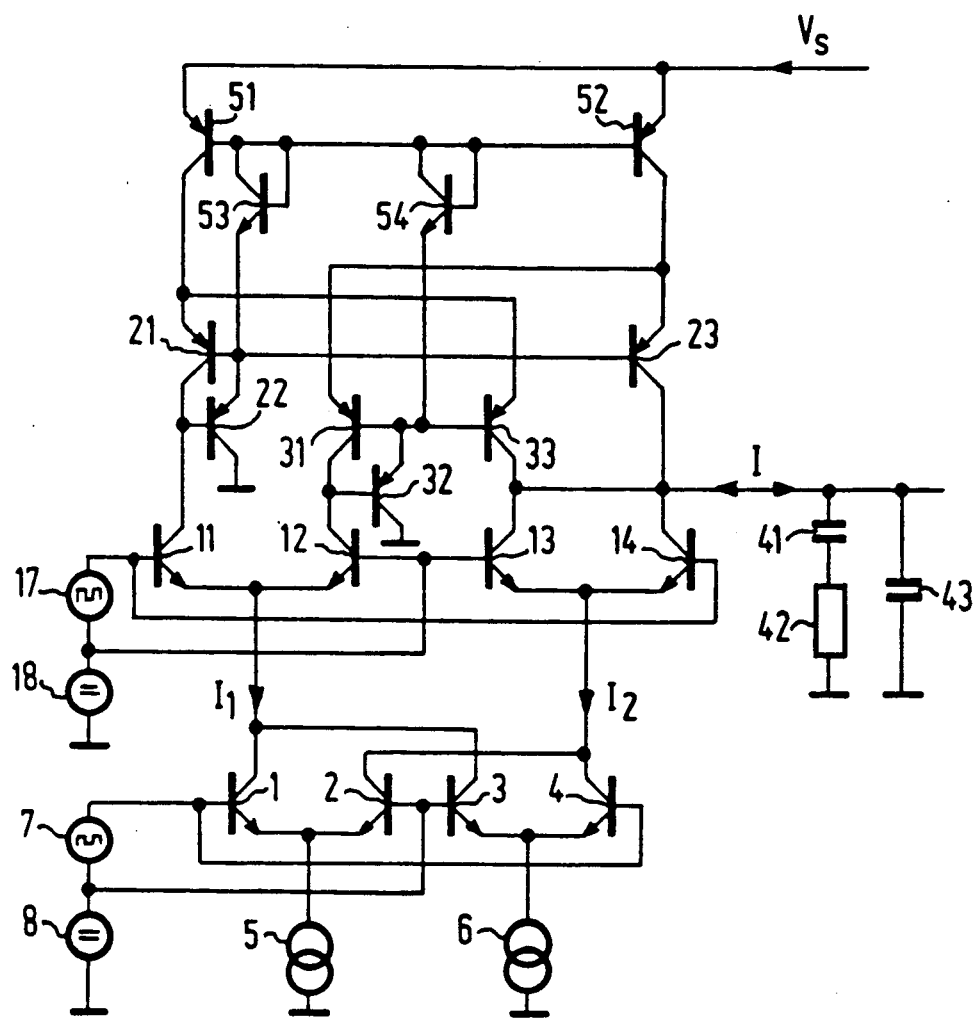

Two embodiments of the invention will be described in greater detail with reference to the drawings in which FIG. 1 shows a first embodiment of the phase comparison circuit in which ohmic resistors are arranged as negative feedback circuit elements, FIG. 2 shows a second embodiment using transistors as negative feedback circuit elements.

A phase comparison circuit shown in FIG. 1 is provided as a part of a phase-locked loop in a stereo multiplex decoder.

The phase comparison circuit is provided with a double balanced mixer which comprises four transistors 1, 2, 3 and 4. The first balanced mixer, which comprises the transistors 1 and 2, is constructed in such a way that the two emitters of the transistors 1 and 2 are connected to a current source 5 which supplies a sine signal, in this example the 19 kHz pilot of an FM stereo multiplex signal. The emitters of the transistors 3 and 4 of the second balanced mixer stage are connected to a current source 6 which supplies the same signal as the current source 5, but in phase opposition to this signal. The bases of the transistors 1 and 4 are connected to the one terminal of a voltage source 7, while the bases of the transistors 2 and 3 are connected to the other terminal of this voltage source 7. The voltage source 7 supplies a 19 kHz square-wave switching signal which is derived from the frequency of a phase-locked loop (not shown) which incorporates the phase comparison circuit shown in the Figure.

The switching voltage source 7 is connected to ground via a DC source 8 which supplies the DC voltage required for the transistors.

The collectors of the transistors 1 and 3 and the collectors of the transistors 2 and 4 are interconnected at the output of the mixer. A current $I_1$ flows through the common terminal thus formed of the transistors 1 and 3 and a current $I_2$ flows through the common terminal of the transistors 2 and 4.

A switching stage comprising four transistors 11, 12, 13 and 14 is connected to these two mixer outputs. The emitters of the transistors 11 and 12 are connected to the mixer output conveying the current $I_1$, while the emitters of the transistors 13 and 14 are connected to the mixer output conveying the current $I_2$. The bases of the transistors 11 and 14 are connected to a voltage source 17 which supplies the same square-wave switching voltage as the voltage source 7. The voltage source 17 will correspond to the voltage source 7 in its practical realization, but an adequate decoupling should be provided. The voltage source 17 is connected to ground via a DC source 18 which is used for the same purpose as the voltage source 8 in the mixer.

The two transistors 11 and 14 of the switching stage are used to connect a first current mirror circuit to the mixer terminals conveying the respective currents $I_1$ and $I_2$. To this end the collector of the transistor 11 is connected to the collector of a transistor 21 and to the base of a transistor 22 both of which form part of a first current mirror circuit. The collector of the transistor 22 is connected to ground, while the emitter of the transistor 22 is connected to the base of the transistor 21 and to the base of a further transistor 23 which also forms part of the first current mirror circuit. The emitter of the transistor 21 is connected to a power supply voltage via a resistor 24 and the emitter of the transistor 23 is also connected to this voltage via a resistor 25. The resistors 24 and 25 have the same nominal resistance; however, fluctuations of the actual resistances are unavoidable in practice.

The transistors 21, 22, 23 and the resistors 24 and 25 jointly constitute the first current mirror circuit.

A second current mirror circuit is provided, which comprises three transistors 31, 32 and 33 connected in the same way as the transistors 21, 22 and 23 in the first current mirror circuit. The collector of the transistor 12 is connected to the collector of the transistor 31 and to the base of the transistor 32, while the collector of the transistor 13 is connected to the collector of the transistor 33. The second current mirror circuit also operates with the resistors 24 and 25 determining the negative feedback. However, in the second current mirror circuit the emitter of the transistor 31 is connected to the power supply voltage via the resistor 25 and the emitter of the transistor 33 is connected to this voltage via the resistor 24.

This cross-connection ensures that the resistor 24 in the first current mirror circuit determines the input-sided negative feedback, while the output-sided negative feedback in this current mirror circuit is determined by the resistor 25. In the second current mirror circuit the resistors are inversely operative, i.e. the resistor 25 determines the input-sided negative feedback, while the resistor 24 determines the output-sided negative feedback.

The collectors of the transistors 23 and 33, connected together with the collectors of the transistors 13 and 14, constitute the output of the phase comparison circuit.

In addition to the phase comparison circuit, FIG. 1 shows a loop filter of a phase-locked loop, other parts of which are not shown in the Figure, which filter has a low-pass filtering function. The loop filter comprises a series arrangement of a capacitor 41 and a resistor 42 which is connected to ground, as well as a grounded capacitor 43.

The operation of the phase comparison circuit with the subsequently arranged loop filter shown in FIG. 1 will be described hereinafter.

During a first half cycle of the square-wave switching voltage, which is positive during this period, the transistors 1 and 4 are turned on via the voltage sources 7 and 8 and the transistors 11 and 14 are turned on via the voltage sources 17 and 18. As a result, the current supplied by the current source 5 and having a sinusoidal character is applied to the input of the first current mirror circuit, i.e. to the transistors 21 and 22. The transistors 4 and 14 are also turned on. The same current, which is, however, in phase opposition to the current of the source 5, is applied to these transistors via the current source 6. If the signals supplied by the voltage sources 7 and 17 on the one hand and the current sources 5 and 6 on the other hand are in their nominal phase position and if it is further assumed that the current mirror circuit operates correctly, i.e. if it supplies exactly the same current at its output as the current applied to its input, the same current flows in the two terminals of the mixer as well as at the input and output of the current mirror circuit so that, averaged in time, no direct current flows in the loop filter of the phase-locked loop, further parts of which are not shown in the Figure.

In this respect it is, however, assumed that the resistors 24 and 25 have exactly the same resistance. However, this will generally not be the case, particularly when such circuit arrangements are mass-produced. As a result, the current flowing at the output of the current mirror circuit is not equal to the current flowing at the input, i.e. it is larger or smaller. In a phase comparison circuit this results in a so-called offset current, because the output of the current mirror circuit does not convey the same current as in the corresponding terminal of the mixer, which conveys the current $I_2$. This equalizing current flows through the output of the phase comparison circuit, i.e. towards the loop filter.

In state of the art phase comparison circuits this offset current has the same sign during both half cycles of the square-wave switching signal which is supplied by the voltage sources 7 and 17. As a result, the phase-locked loop produces an unwanted phase shift between the square-wave switching signal and the sine signal.

However, the phase comparison circuit shown in FIG. 1 is provided with a second current mirror circuit which operates during the second half cycle of the square-wave switching signal in which the voltage sources 17 and 7 turn on the transistors 2 and 3 of the mixer and the transistors 12 and 13 of the switching stage. The current mirror circuit constituted by the transistors 31, 32, 33 and the resistors 24 and 25 is then active. Now the current source 6 is connected to the input of the second current mirror circuit via the transistor 3 and the transistor 12, and the output of this circuit is connected to the current source 5 via the transistor 13 and the transistor 2.

If it is assumed, as is generally the case in practice, that the resistors 24 and 25 do not have exactly equal resistances, an offset current also occurs at the output of the phase comparison circuit during this second half cycle. However, due to the cross-connection arrangement of the resistors 24 and 25 determining the negative feedback of the two current mirrors, this offset current occurs with a reverse sign during the second half cycle as compared with the current occurring during the first half cycle of the square-wave switching signal.

The reason of this relationship will be briefly explained hereinafter.

During the first half cycle, when the transistors 1, 11, 4 and 14 are turned on and the first current mirror circuit with the transistors 21, 22 and 23 is operative, the following relation holds:

$$I_1 * R_{24} = I_2 * R_{25},$$

in which $R_{24}$ and $R_{25}$ are the ohmic resistances of the resistors 24 and 25. Solved for $I_1$, this results in $$I_1 = I_2 * R_{25}:R_{24}.$$

During the second half cycle of the square-wave switching voltage the transistors 2, 13, 3 and 12 are turned on and the second current mirror circuit with the transistors 31, 32 and 33 is active. The following relation then holds:

$$I_1 * R_{25} = I_2 * R_{24}.$$

Thus it holds that $$I_1 = I_2 * R_{24}:R_{25}.$$

If the offset current $I_{off}$, i.e. the current which in spite of the correct phase position flows through the output of the phase comparison circuit, is defined as:

$$I_{off} = I_1 - I_2,$$

it is immediately clear that the offset current during the first half cycle of the switching voltage has a value which in a first approximation is exactly as large as the current during the second half cycle, but with an opposite sign As a result of the integration of the offset currents occurring with an alternating sign in the subsequently arranged loop filter during the half cycle clock, the influence of resistance fluctuations of the resistors 24 and 25, as averaged in time, is thus eliminated. In spite of deviating resistances a correct phase position of the sine signals supplied by the current sources 5 and 6 relative to the switching signals supplied by the voltage sources 7 and 17 is obtained when the phase comparison circuit is used in a phase-locked loop (PLL).

A second embodiment of the phase comparison circuit shown in FIG. 2 comprises four transistors 51, 52, 53 and 54 instead of the resistors 24 and 25 in the phase comparison circuit of FIG. 1, but it is otherwise arranged in the same manner as the phase comparison circuit of FIG. 1.

To this end the emitter of the transistor 21 is connected to the collector of a transistor 51 whose emitter receives a power supply voltage, likewise as the emitter of a further transistor 52 whose collector is connected to the emitter of the transistor 23. The bases of the transistors 51 and 52 are interconnected. The bases of the two transistors 51 and 52 are further connected to the bases and collectors of two further transistors 53 and 54. The emitter of the transistor 53 is connected to the bases of the transistors 21 and 23 and the emitter of the transistor 54 is connected to the bases of the transistors 31 and 33.

The differential output resistances of the collector-emitter paths of the transistors 51 and 52 determine the extent of negative feedback of the two current mirror circuits similarly as for the resistors 24 and 25, the two transistors 51 and 52 are alternately operative in the half cycle clock of the switching signal for the two current mirror circuits, so that the differential output resistance of the transistor 51 determining the negative feedback is operative for the input-sided negative feedback of the first current mirror circuit and for the output-sided negative feedback of the second current mirror circuit. The reverse applies to the differential output resistance of the transistor 52.

The base bias for the two transistors 51 and 52 is supplied by the transistors 53 and 54. During the first half cycle the transistors 11 and 14 are active so that the switching voltage at the base of transistor 21 drives the transistor 52. During the second half cycle, in which the transistors 12 and 13 are turned on, the transistor 54 is driven in a corresponding manner. For integrating possibly occurring offset currents, the same applies as for the circuit according to FIG. 1.

This modified current mirror circuit in the phase comparison circuit according to FIG. 2 has the additional advantage that the output resistance of the phase comparison circuit at the collectors of the transistors 23 and 33 is considerably higher than that of the phase comparison circuit shown in FIG. 1.

We claim:

1. A phase comparison circuit, particularly for a phase-locked loop (PLL) in a decoder for multiplex signals, comprising a double balanced mixer stage which receives a sine signal, particularly the pilot of a multiplex signal, as well as said sine signal in anti-phase and a square-wave switching signal of the same switching frequency, which switching signal is derived particularly from the frequency of a phase-locked loop, characterized in that two active current mirror circuits are provided whose outputs supply the phase comparison signal and in which at least two common negative feedback circuit elements (24, 25) are arranged, the first element (24) being operative in the input-sided negative feedback of the first current mirror circuit and in the output-sided negative feedback of the second current mirror circuit, and the second element (25) being operative in the output-sided negative feedback of the first current mirror circuit and in the input-sided negative feedback of the second current mirror circuit, and in that the two current mirror circuits are alternately connected to the two balanced mixer stages by means of a switching stage during the half cycle clock of the switching signal.

2. A phase comparison circuit as claimed in claim 1, characterized in that the switching stage has two transistors (11, 12) which in the half cycle clock of the switching signal alternately connect the output of one of the two balanced mixer stages to the input of the first current mirror circuit during one half cycle and which connect the output of the second balanced mixer stage to the input of the second current mirror circuit during the other half cycle, and in that two further transistors (13, 14) connect the outputs of the current mirror circuits to the respective other mixer.

3. A phase comparison circuit as claimed in claim 1, characterized in that two ohmic resistors (24, 25) are provided as negative feedback circuit elements 4. A phase comparison circuit as claimed in claim 1, characterized in that two transistors (51, 52) are provided as negative feedback circuit elements whose differential output resistances of the collector-emitter paths determine the input-sided and output-sided negative feedback of the current mirror circuits and whose base bias is processed in dependence upon the square-wave switching signal by means of two further transistors (53, 54) which alternately supply the base bias during a respective half cycle of the switching signal.

5. A phase comparison circuit as claimed in claim 2 characterized in that two ohmic resistors (24, 25) are provided as negative feedback circuit elements.

6. A phase comparison circuit as claimed in claim 2, characterized in that two transistors (51, 52) are provided as negative feedback circuit elements whose differential output resistances of the collector-emitter paths determine the input-sided and output-sided negative feedback of the current mirror circuits and whose base bias is processed in dependence upon the square-wave switching signal by means of two further transistors (53, 54) which alternately supply the base bias during a respective half cycle of the switching signal.

* * * * *